US005836071A

United States Patent [19]
Falcone et al.

[11] Patent Number: 5,836,071
[45] Date of Patent: Nov. 17, 1998

[54] METHOD TO PRODUCE KNOWN GOOD DIE USING TEMPORARY WIRE BOND, DIE ATTACH AND PACKAGING

[75] Inventors: Robert J. Falcone, Odessa; Stephen R. Martin, Midland, both of Tex.

[73] Assignee: Texas Instrument Incorporated, Dallas, Tex.

[21] Appl. No.: 777,844

[22] Filed: Dec. 26, 1996

[51] Int. Cl.$^6$ .......................... H05K 13/00; G01R 31/02
[52] U.S. Cl. ............................... 29/593; 29/827; 29/840; 29/854; 324/158.1; 324/765
[58] Field of Search .......................... 29/593, 827, 840, 29/854; 324/158.1, 754, 755, 765

[56] References Cited

U.S. PATENT DOCUMENTS

| | | | |
|---|---|---|---|
| 5,227,583 | 7/1993 | Jones | 29/854 X |
| 5,448,165 | 9/1995 | Hodge et al. | 324/158.1 |
| 5,528,157 | 6/1996 | Newberry et al. | 324/754 |
| 5,548,884 | 8/1996 | Kim | 29/593 |
| 5,644,247 | 7/1997 | Hyun et al. | 324/755 |

FOREIGN PATENT DOCUMENTS

| | | | |
|---|---|---|---|
| 3233950 | 10/1991 | Japan | 29/827 |
| 4096238 | 3/1992 | Japan | 29/827 |

*Primary Examiner*—Peter Vo
*Attorney, Agent, or Firm*—W. James Brady, III; Richard L. Donaldson

[57] ABSTRACT

A method for temporarily packaging a semiconductor die, includes attaching the semiconductor die (40) to a die support (60) in a cavity (58) of package housing (56) with an adhesive (52) that will cures at a first low temperature and volatilizes at a second, higher temperature that is less than the temperature that will drive diffusions in the die deeper and change the electrical characteristics of the die. A reverse bonding process is used to form a first wedge bond with a relatively soft wire (88) on a conductive pad (62) extending into cavity (58) and a second wedge bond on a bond pad (41) on die (40). The wedge tool (76) used to make the wedge bonds has a front radius which is larger than that on conventional wedge tools, so that the cross-sectional area of the bond heel (91) is increased. The increased cross-sectional area and soft wire permit the wire to be removed from the bond pad (41) without breaking the wire or significantly damaging the bond pad. Die 40 may be burned-in or tested following bonding by placing the package housing (56) in a tester. The wire (88) is then pulled to break the wedge bond on bond pad (41) and adhesive (52) exposed to the second temperature to volatilize the adhesive to permit the die (40) to be picked up from the die support (60). This temporary packaging method permits die to be packaged, tested, and removed from the package without damaging them.

11 Claims, 5 Drawing Sheets

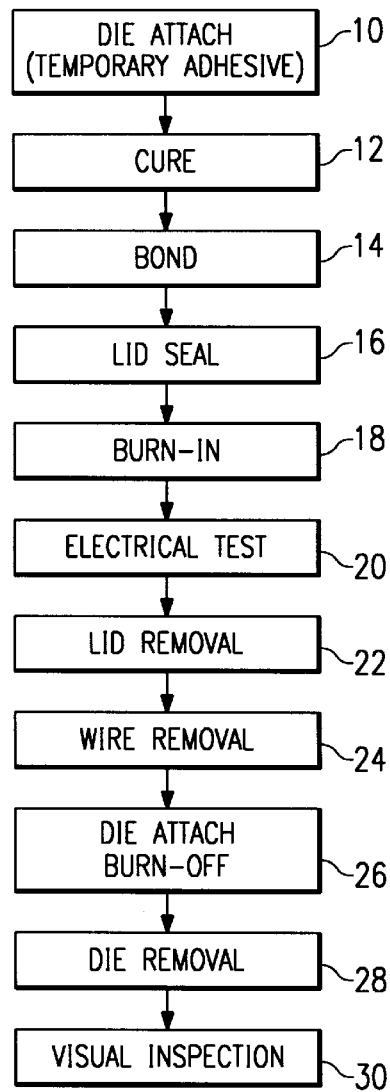
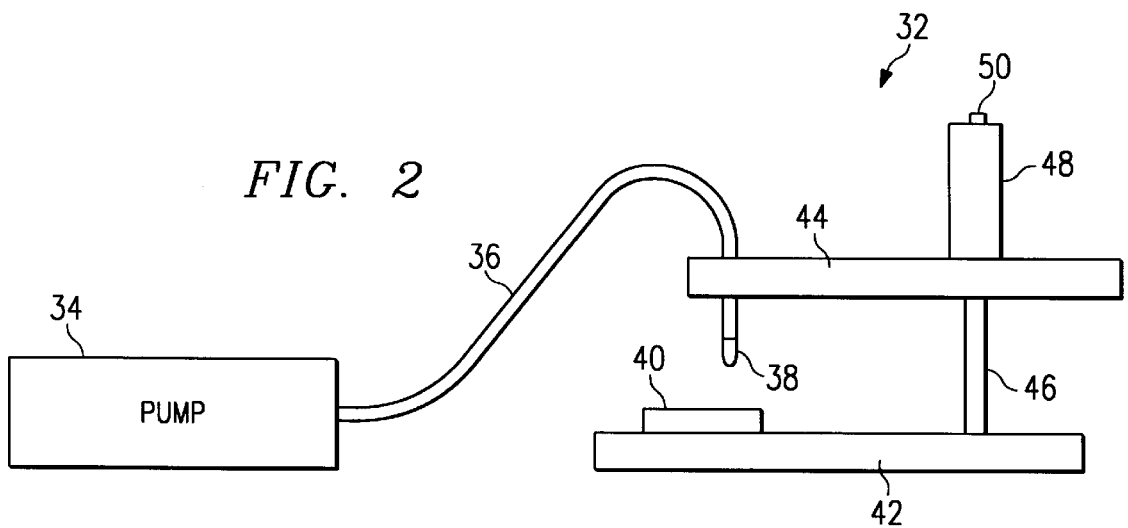

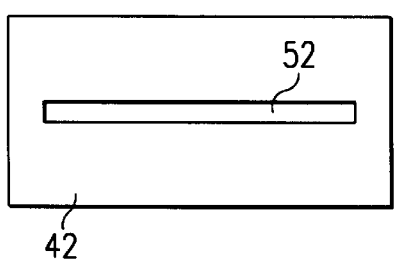
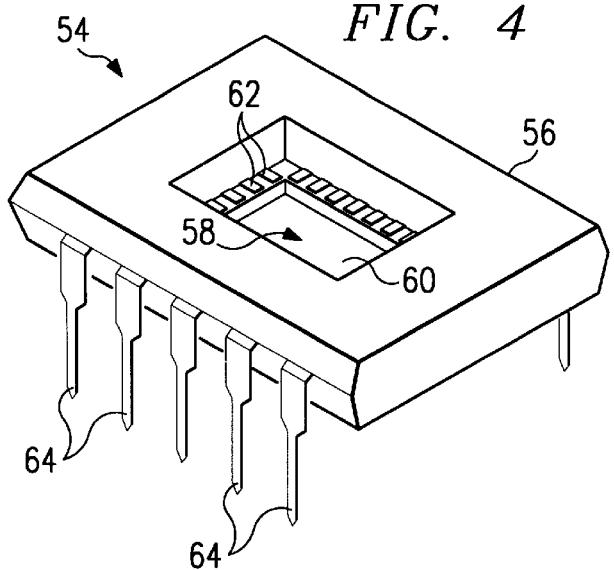
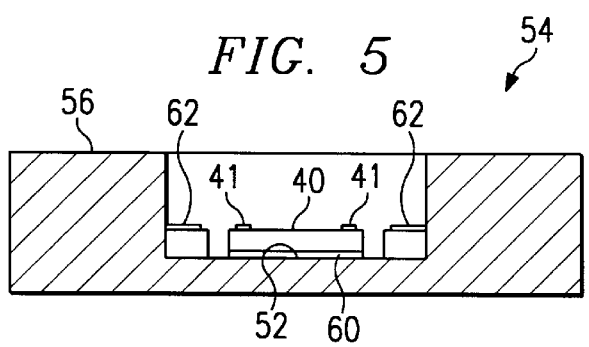
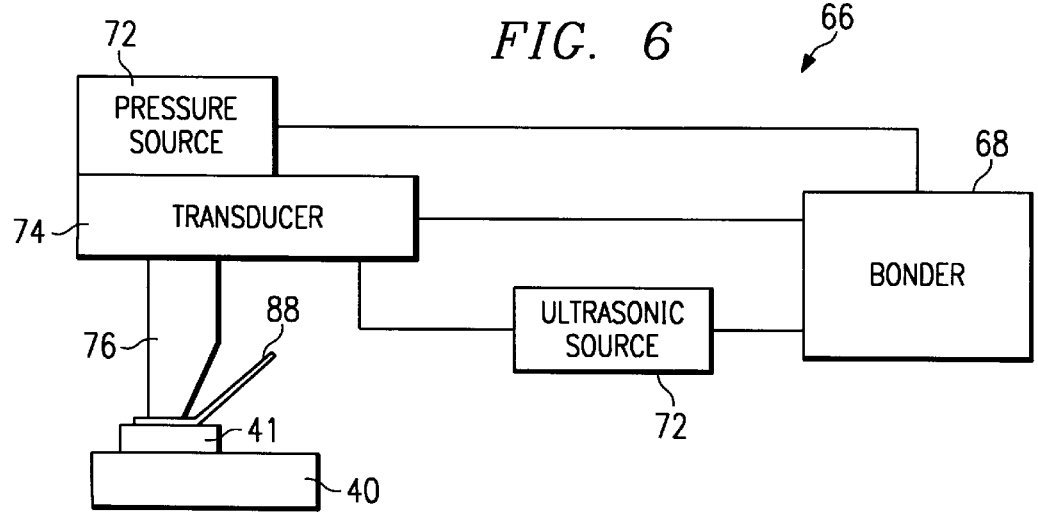

ated with 95% will produce an MCM first pass test yield of only 35%. Such a low yield will result in an undesirable quantity of material scrap and require very expensive and labor intensive rework. The use of known good die is required to achieve optimal first pass test yields in producing multi-chip modules in either a chips first or chips last assembly approach.

METHOD TO PRODUCE KNOWN GOOD DIE USING TEMPORARY WIRE BOND, DIE ATTACH AND PACKAGING

FIELD OF THE INVENTION

This invention relates to semiconductor devices and, more particularly, to a method for producing known good die using temporary wire bonding, die attach and packaging.

BACKGROUND OF THE INVENTION

The semiconductor industry is entering a new phase of packaging density with the development of electronic modules containing multiple integrated circuit (IC) die. Recent increases in semiconductor device clock speeds, the number of inputs and outputs, die densities, and pad densities have made it desirable to package a variety of different integrated circuits, such as microprocessors, ASIC devices, and memory devices, together into multi-chip modules (MCM) and hybrids to create high performance products.

A factor identified by the industry as critical to the successful development of multi-chip modules is the availability of "known good die" (KGD). A known good die is a die in which there is a very high confidence level that it will operate reliably over its intended lifetime. With many die mounted into a multi-chip module, the compound effect of the individual yields of the different die becomes an issue. For example, twenty die assembled into a multi-chip module (MCM) having individual yields of 95% will produce an MCM first pass test yield of only 35%. Such a low yield will result in an undesirable quantity of material scrap and require very expensive and labor intensive rework. The use of known good die is required to achieve optimal first pass test yields in producing multi-chip modules in either a chips first or chips last assembly approach.

Since semiconductor die exhibit early life failures when tested across time, "burn-in" testing at elevated temperatures is used to identify potentially defective die and separate them from the remaining known good die. The potentially defective die are discarded and only the remaining known good die are placed in their final packaging configuration. One current test method uses mechanical probe needles at wafer level probe. Drawbacks to this method include the high cost of probe testers and the fact that the mechanical probe needles have limited density capability.

Another test method uses TAB (tape automated bonding) tape at the die level. A drawback to this method is that TAB tape in higher density configurations is costly and requires circuit area for application to a packaging scheme. In addition, the availability of TAB tape is limited at present.

Currently, the most widely used method in obtaining known good die (KGD) is packaging the die using conventional die attach, wire bonding and encapsulation techniques; testing the die in the package; and removing the die from the package. Removing the die from the package requires separating the bond wires from the bond pads. Separating wires attached using conventional wire bonding techniques tends to damage the bond pads on the device, resulting in lower yielding bonds. In addition, separating the die attached to a die pad with conventional die attach materials requires force which in many cases is sufficient to result in chipping of the die.

In light of present test methods, manufacturers must currently decide between assembling multi-chip modules or hybrids with pre-tested, but damaged semiconductor die or die which have not been tested or conditioned.

Accordingly, a need exists for an inexpensive method for producing known good that have been tested but are not damaged.

SUMMARY OF THE INVENTION

In one aspect of the invention, a method for temporarily packaging a semiconductor die, includes the steps of: attaching the semiconductor die to a die support in a package housing with an adhesive; forming an electrical connection between at least one conductor extending outside the package housing and a corresponding bond pad on the die; breaking the electrical connection between the at least one conductor extending outside the package housing and the corresponding bond pad; and exposing the adhesive to heat to volatilize the adhesive sufficiently to permit the die to be picked up from the die support.

In another aspect of the invention, a method for forming a temporary electrical connection bond between a conductive pad and a bond pad on a semiconductor die, includes the steps of: wedge bonding a wire having a tensile strength of about 22.2 grams and an elongation in the range of about 4.5–5%.to the conductive pad with a wedge tool having a front radius of about 0.002 inches; stringing the wire from the conductive pad to the semiconductor die; and wedge bonding the wire to the bond pad on the semiconductor die.

It is an advantage of the invention that undamaged, known good die can be produced using a temporary wire bonding, die attach and packaging method. The method of the invention advantageously permits die to be packaged, tested, and removed from the package without damaging them.

BRIEF DESCRIPTION OF THE DRAWINGS

FIG. 1 is a flow diagram of a process for producing known good die according to the present invention;

FIG. 2 shows a dispenser for applying temporary die attach adhesive to a die;

FIG. 3 shows the back side of a die having temporary die attach adhesive applied in a single centerline pattern;

FIG. 4 is a perspective view of a temporary package for mounting a die to be burned-in and tested;

FIG. 5 is a cross-sectional view of the temporary package of FIG. 4 with a die mounted in its cavity;

FIG. 6 shows a wedge bonder for bonding wires from conductive pads in the package to bond pads on the die;

DETAILED DESCRIPTION OF PREFERRED EMBODIMENTS

Figure 7:
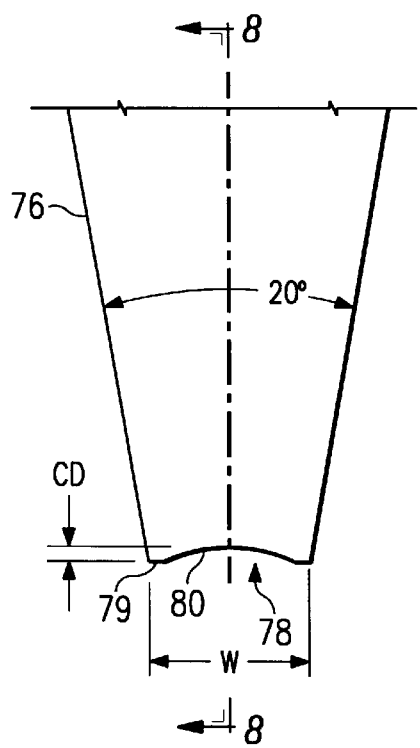
FIG. 7 is a front view of a wedge according to the invention used to bond wires to bond pads on the die.

FIG. 1 is a flow chart of a process for producing known good die according to the present invention. At step 10, temporary die attach is performed by placing a temporary die attach adhesive on the backside of a die to be tested and placing the backside of the die on a die pad located in a cavity of a test package. The test package is a ceramic package, for example, and the temporary die attach adhesive is an adhesive that cures at a first low temperature and will volatilize at a second higher temperature that is less than the temperature, typically about 400–500 degrees Centigrade, at which diffusions in the die will be driven deeper thus changing the electrical characteristics of the device. A suitable adhesive for temporary die attach is Quantum Materials VWR-102 adhesive.

At step 12, the die attach adhesive is cured by placing the test package in an oven at an elevated temperature for a selected period of time. Curing of the die attach adhesive insures that the die to be tested will remain securely attached to the die pad during burn-in and testing. Suitable curing using Quantum Material VWR-102 adhesive is obtained by placing the test package in an oven at about 150 degrees Centigrade for approximately 50 minutes.

At step 14, the die is wire bonded to leads extending into the cavity in which the die is mounted on the die pad. Wire bonding is accomplished using a reverse bonding process in which each wire is attached to a conductive pad in the package and a bond pad on the die by forming a first wedge bond on the conductive pad, stringing the wire to the die and then forming a second wedge bond on the bond pad. The use of reverse bonding eliminates the drag force of the bond head on the wire after forming the second wedge bond. There is drag force on the wire during bond head movement in the "z" or vertical direction when stringing the wire from the first wedge bond to the die, but this drag force stresses only the first wedge bond. Since there is no drag force applied to the wire after forming the second wedge bond, the second wedge bond is not stressed and less energy is needed to form a reliable bond on the die.

As will be explained below, a relatively soft bond wire is used in conjunction with a wedge having a front radius larger than is conventional in order to produce a bond that is strong enough to hold during burn-in and testing but can be broken with minimal damage to the bond pad by pulling on the wire. The soft wire permits easy deformation of the wire by the wedge to achieve a large bond area. The increased front radius of the wedge results in increased thickness of the wire adjacent the bond. The increased thickness of the wire adjacent the bond results in increased wire strength permitting wire removal without breaking the wire.

At step 16, a lid is affixed to the package with an adhesive to seal the cavity in which the die is mounted. A suitable lid is a Plastalloy Combos lid available with a polymer adhesive applied from Semi-Alloys Co. The lid is placed over the cavity and its bottom surface is brought into contact with the surface of the package adjacent the cavity. The package is placed in an oven at a low temperature, about 150 degrees Centigrade, for example, for about 10 minutes to cure the epoxy and thus securely attach the lid to the package during burn-in and testing.

At step 18, burn-in of the die is performed by placing the package in a socket and operating the die under conditions selected to cause most die that would normally be subject to infant mortality failure to actually fail. The particular conditions selected depend on the type of die being burned-in and its application. Typically, such conditions include increased temperature, increased voltage, and high-current load conditions.

At step 20, electrical testing of the die is performed by applying predetermined electrical test input signals to selected package leads and monitoring output signals produced by the die on selected package leads.

At step 22, the lid is removed from the package by applying a shear force between the lid and package seal ring. A razor blade is suitable for applying the shear force.

At step 24, bond wires are removed using a conventional wire pull tester or by hand pulling with the use of tweezers and a microscope. The wire pull tester pulls on the wires with sufficient force to peel the bonded portion of the wire off the bond pad leaving very little damage to the bond pad.

At step 26, die-attach burn-off is performed by placing the package in an oven at a temperature and for a period of time sufficient to burn-off or volatilize the die attach adhesive sufficiently to permit the die to be picked up with a vacuum tool from the die support. For example, where the temporary die attach adhesive is Quantum Materials VWR-102 adhesive, exposing the package to a temperature in the range of about 320–340 degrees Centigrade for approximately one hour will burn off the adhesive sufficiently so that the die can be removed from the die pad by a vacuum tool.

Burn-off of the die attach adhesive eliminates the need to pull or pry the die with force sufficient to break the bond of the die attach material. Burn-off thus eliminates the scratching, chipping, and cracking of the die associated with pulling or prying the die off the die support with enough force to break the adhesive bond.

At step 28, the die is removed from the package cavity. A vacuum tool is placed on the top surface of the die, vacuum is applied to the die, and the vacuum tool is moved to lift the die out of the package cavity.

At step 30, the die is visually inspected for chips and cracks and damage to bond pads.

FIG. 2 shows a dispenser 32 for applying temporary die attach adhesive to a die in a single centerline pattern. Dispenser 32 includes a pump unit 34 which forces the adhesive through a tube 36 to a nozzle 38, a support on which die 40 is mounted with its back side 41 up, an arm 44 rotatably mounted on vertical support 46, a handle 48, and a vacuum valve 50. Nozzle 38 is placed adjacent the center of die 40 and adhesive is dispensed along the centerline of the back surface of die 40. Other dispense patterns may also be used instead of the single centerline pattern. For example, the adhesive may be dispensed around the periphery of the die. A suitable dispenser is the Model 915 manufactured by EFD. Where the temporary die attach adhesive is Quantum Materials VWR-102 adhesive, a satisfactory single centerline adhesive pattern may extend 75% of the die length and 20% of the die width, for example. For a die having a length of 544 mils and a width of 241 mils, a satisfactory single centerline adhesive pattern can be produced with the EFD Model 915 using two dispenses per die, 0.45 seconds per dispense, and a pressure of 3.5 psi.

FIG. 3 shows die 40 with a single adhesive pattern 52 formed along the centerline of its backside 42.

FIG. 4 is a perspective view of a temporary package 54 for mounting a die to be burned-in and tested. Temporary package 54 includes a ceramic housing 56 having a cavity 58 in which a die support 60 is located. Conductive pads 62 extend into cavity adjacent die support 60. Conductive pads 62 are electrically connected to leads 64 which extend from the sides of housing 56. Housing 56 could be formed from materials other than ceramic, such as plastic for example. In addition, although package 54 is shown as a through-hole dual-in-line package, it is understood that other through-hole and surface mount package configurations could be used, such as quad flatpack, leadless chip carrier, vertical, zig-zag, pin-grid array, ball-grid array, for example.

FIG. 5 is a cross-sectional view of package 54 after completion of step 10 of FIG. 1 and shows die 40 affixed to die support 60 by adhesive 52.

FIG. 6 shows a wedge bonder 66 for bonding wires from conductive pads 62 in package 54 to bond pads on the die. Wedge bonder 66 includes control unit 68 which is connected to and controls ultrasonic power source 70, pressure source 72, and transducer 74. A suitable wedge bonded is the Abacus IIIU ultrasonic wedge bonder produced by Texas Instruments, Inc. Pressure source 72 applies pressure in the range of 12–24 grams to transducer 74 during bonding. Ultrasonic power source 70 applies ultrasonic energy, for example in the range of 20 to 70 KHz, to transducer 74 during bonding. A wedge bond tool or wedge 76 is connected to transducer 74 to impart ultrasonic energy to the interface between bond wire 80 and bond pad 40 on integrated circuit die 40.

FIG. 7 is an enlarged front view of the lower portion of wedge bond tool or wedge 76 according to the invention. Wedge 76 has a concave bottom surface 78 which has a width W of 0.004 inches, for example, and extends a distance CD of 0.0002 inches, for example, from bottom edge 79 to top point 80 of concave bottom surface 78.

Figure 8:
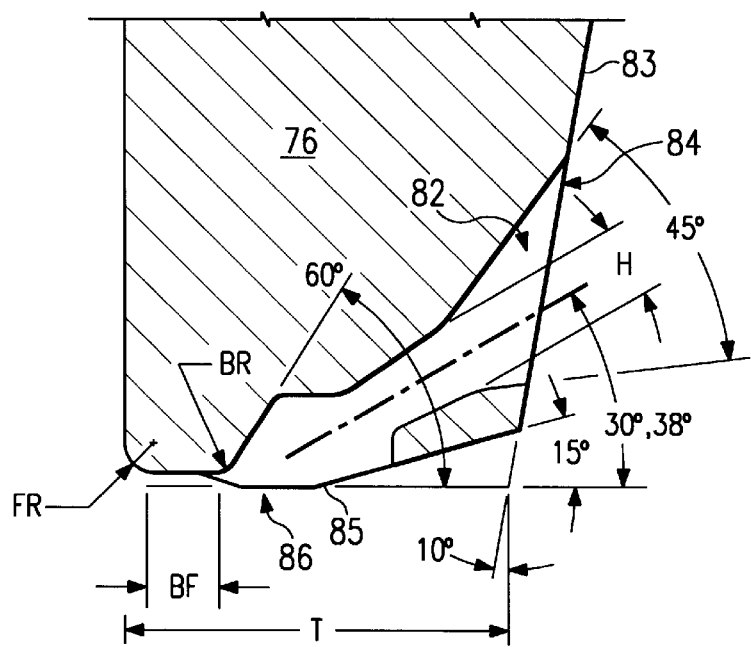
FIG. 8 is a cross-sectional view of the wedge of FIG. 7.

FIG. 8 is a cross-sectional view of wedge 76 taken along section lines 8—8 of FIG. 7. Wedge 76 has a bore 82 through which a wire passes. Bore 82 has an opening 84 on the back side 83 and an opening 86 on the bottom 85 of wedge 76. Wedge 76 has a front radius FR of about 0.002 inches. Applicants have discovered that a front radius of about 0.002 inches produces a temporary bond that results in good electrical connection of a wire to bond pads on a die but also permits the wire to be easily removed with little disturbance to the bond pad. Conventional wedges for wedge bonding use a front radius of 0.001 inches. Removal of wires bonded with conventional wedges typically results in severe damage to the bond pad or in wire breakage which leaves the wire bond attached to the bond.

Wedge 76 preferably also has a bond foot length BF of 0.0015 inches, for example, a back radius BR of 0.001 inches, for example, a length T of 0.015 inches, for example, and a wire opening height H of 0.0025 inches, for example.

Figure 9:
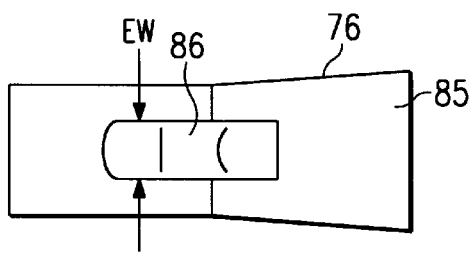
FIG. 9 is a bottom view of the wedge of FIG. 7.

FIG. 9 is a bottom view of wedge 76. Opening 85 of wedge 76 has a width EW of 0.0002 inches, for example.

Figure 10A:
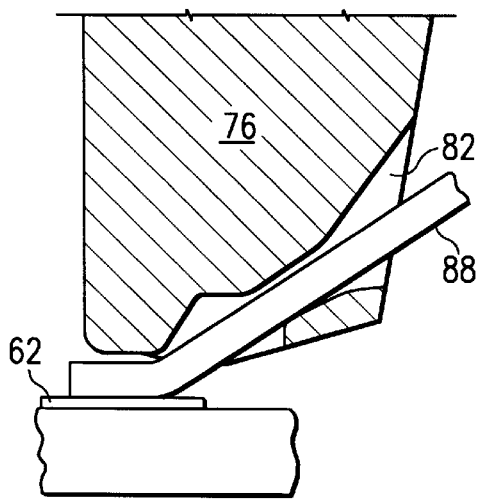
FIG. 10a shows the wedge of FIG. 7 in the process of bonding a wire to a conductive pad in the temporary package.

FIG. 10a shows wedge 76 in the process of forming the first wedge bond in the reverse bonding process. Wedge 76 bonds a wire 88, which extends through bore 82, to a conductive pad 62 in package 54. After forming the first wedge bond, wedge 76 is moved to bond pad 41 on die 40 to form the second wedge bond in the reverse bonding process.

Figure 10B:
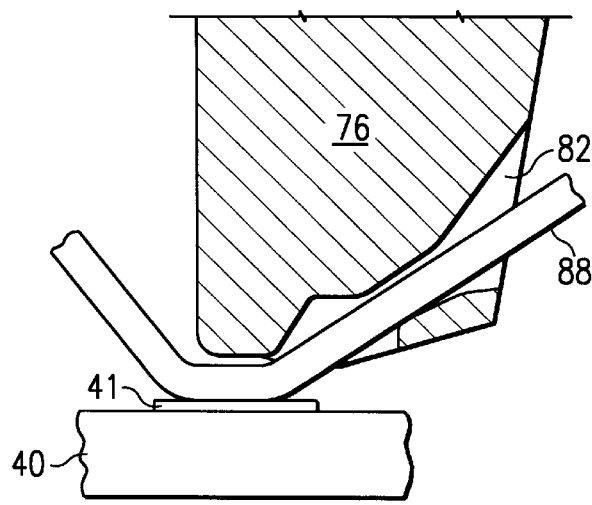
FIG. 10b shows the wedge of FIG. 7 in the process of bonding a wire to a bond pad on the die.
Figure 10C:
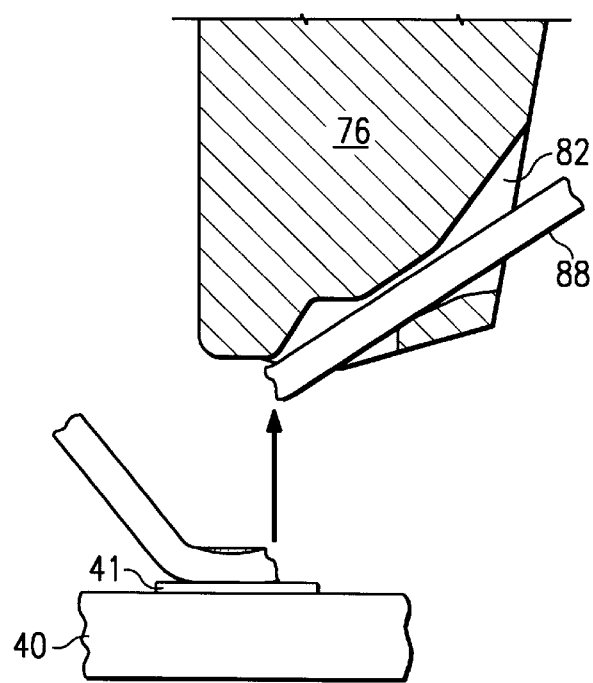
FIG. 10c shows the wedge of FIG. 7 after the bonding a wire to a bond pad on the die.

FIG. 10b shows wedge 76 in the process of forming the second wedge bond in the reverse bonding process. Wedge 76 bonds wire 88 to a bond pad 41 on die 40. Wire 88 is preferably a soft wire which deforms easily to 1.) provide a large surface area in contact with bond pad 41, thus resulting in a good electrical connection, and 2.) permit pull off from bond pad 41 without breaking or damaging bond pad 41. Wire 88 may be formed from an aluminum/silicon(1%) alloy and have a thickness of 1.25 mils. Wire 88 preferably has a tensile strength of about 22.2 grams and an elongation in the range of 4.5–5%. After forming the second wedge bond, wire 88 is broken by bonder 66 leaving wire 88 bonded to bond pad 41 as shown in FIG. 10c.

Figure 11A:
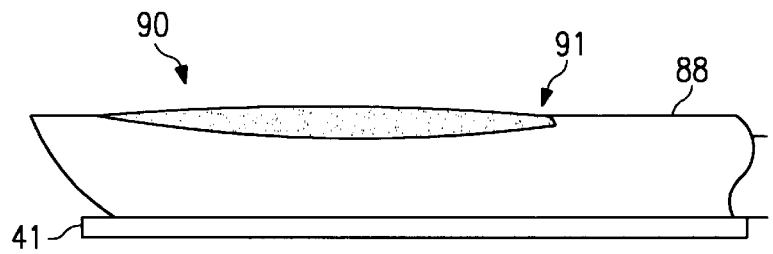
FIG. 11a shows a bond formed with the wedge of FIG. 5.
Figure 11B:
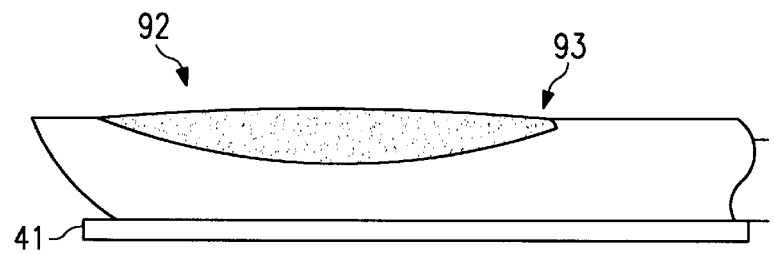
FIG. 11b shows a bond formed with a conventional wedge.

FIG. 11a shows a bond 90 formed with wedge 76 having a front radius of 0.002 inches. FIG. 11b shows a bond 92 formed with a conventional wedge having a front radius of 0.001 inches. As can be seen in FIGS. 11a and 11b the cross-sectional area of bond 90 at bond heel 91 is greater than that of conventional bond 92 at bond heel 93. The increased cross-sectional area of bond 90 at bond heel 91 results in increased wire strength permitting subsequent wire removal without breaking wire 88.

Figure 12:
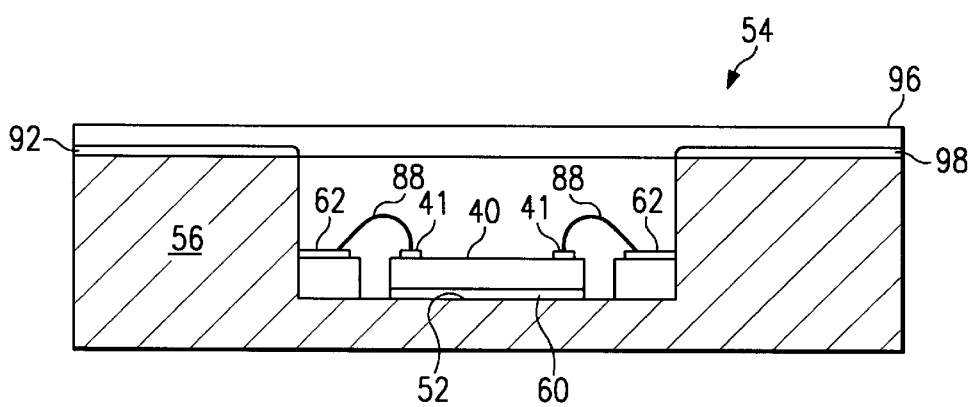
FIG. 12 is a cross-sectional view of the temporary package of FIG. 4 following wire bonding and lid sealing.

FIG. 12 is a cross-sectional view of package 54 after completion of step 16 of FIG. 1 and shows bond pads 41 of die 40 wire bonded to conductive pads 62 by wires 88. Wire bonding is accomplished using a reverse bonding process in which each wire 88 is attached to a conductive pad 62 and a bond pad 41 on the die by forming a first wedge bond on the lead, stringing the wire to the die and then forming a second wedge bond on the bond pad. The use of reverse bonding eliminates the drag force of the bond head on the wire after forming the second wedge bond. Since there is no drag force applied to the wire after forming the second wedge bond, the second wedge bond is not stressed and less energy is needed to form a reliable bond.

After wires 88 are bonded, a lid 96 is sealed to housing 56 with adhesive 98. Lid 96 may be a Plastalloy Combos lid available from Semi-Alloys Co. having a partially cured B-staged polymer as an adhesive. Lid 96 is sealed to housing 56 by using a 2 pound seal clip to hold the lid to the housing and then baking the housing in a oven at about 150 degrees Centigrade for about 10 minutes.

The electrical test in step 20 of FIG. 1 is then performed by placing temporary package 54 in a socket of a conventional tester (not shown) and implementing desired test procedures. Following the electrical test, package 54 is removed from the tester and the lid removal step 22 of FIG. 1 performed by applying a shear force, with a razor blade, for example, between the lid 96 and housing 56 to separate lid 96 from housing 56.

Figure 13:
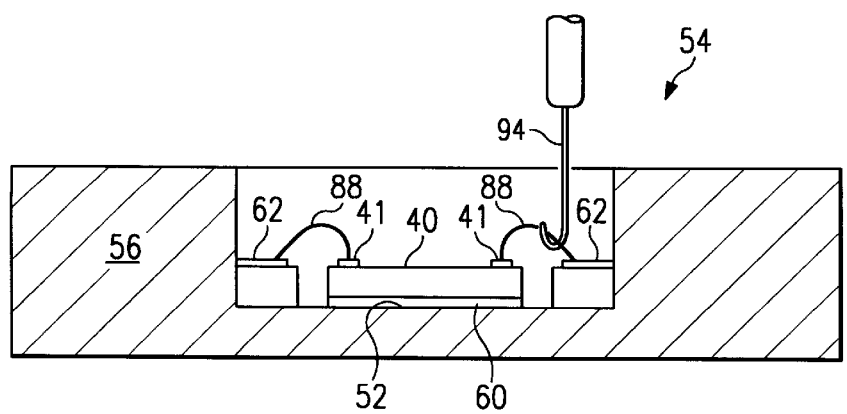
FIG. 13 is a cross-sectional view of the temporary package during wire removal.

FIG. 13 is a cross-sectional view of package 54 during wire removal step 24 FIG. 1. Wires 88 are removed using a conventional wire puller having a hook 94 which pulls on wires 88 with sufficient force to peel the bonded portion of the wire off the bond pad 41 leaving very little damage to the bond pad.

The die-attach burn-off of step 26 of FIG. 1 is then performed by placing package 54 in an oven at a temperature and for a period of time sufficient to burn-off or volatilize the die attach adhesive sufficiently to permit the die to be picked up with a vacuum tool from the die support. For example, where the temporary die attach adhesive is. Quantum Materials VWR-102 adhesive, exposing the package to a temperature of about 330 degrees Centigrade for approximately one hour will burn off the adhesive sufficiently so that the die can be removed from the die pad by a vacuum tool Burn-off of the die attach adhesive eliminates scratching, chipping, and cracking of the die associated with pulling or prying the die off the die support with force sufficient to break the adhesive bond.

The visual inspection of step 30 is then performed on die 40 to check for chips and cracks and damage to bond pads.

It is an advantage of the invention that undamaged, known good die can be produced using a temporary wire bonding, die attach and packaging method. The method of the invention advantageously permits die to be packaged, tested, and removed from the package without damaging them.

A few preferred embodiments have been described in detail hereinabove. It is to be understood that the scope of the invention also comprehends embodiments different from those described, yet within the scope of the claims. For example, other die attach materials capable of volatilizing at low temperatures could be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for temporarily packaging a semiconductor die, comprising the steps of:

attaching the semiconductor die to a die support in a package housing with an adhesive;

forming an electrical connection between at least one conductor within the package housing and a corresponding bond pad on the die by attaching a wire to the at least conductor and the corresponding bond pad;

breaking the electrical connection between the at least one conductor within the package housing and the corresponding bond pad by disconnecting the wire from the bond pad;

exposing the adhesive to heat to volatilize the adhesive sufficiently to permit the die to be picked up from the die support.

2. The method of claim 1, further comprising the step of: testing the die after the step of forming an electrical connection and prior to the step of breaking the electrical connection.

3. The method of claim 1, further comprising the step of: burning-in the die after the step of forming an electrical connection and prior to the step of breaking the electrical connection.

4. The method of claim 1, in which the step of attaching the semiconductor die to a die support with an adhesive, includes the steps of:

applying the adhesive to a backside of the semiconductor die;

placing the backside of the semiconductor die on the die support;

curing the adhesive.

5. The method of claim 4 in which the step of curing the adhesive comprises exposing the adhesive to a temperature of about 150 degrees Centigrade.

6. The method of claim 1 in which the die support is located in a cavity in a package housing.

7. The method of claim 1, in which the die support is located in a cavity in the package housing, the at least one conductive pad extending into the cavity adjacent the die support, the at least one conductive pad electrically connected to at least one conductor extending outside of the package housing, and the step of forming an electrical connection includes the steps of:

wedge bonding a wire to the conductive pad;

stringing the wire from the conductive pad to the semiconductor die;

wedge bonding the wire to the bond pad on the semiconductor die.

8. The method of claim 7 in which the step of wedge bonding is performed with a wedge having a front radius of about 0.0002 inches.

9. The method of claim 8 in which the wire has a tensile strength of about 22.2 grams and an elongation in the range of about 4.5–5%.

10. The method of claim 7 in which the step of breaking the electrical connection between the at least one conductor within the package housing and the corresponding bond pad comprises pulling the wire to peel the bonded portion of the wire from the bond pad.

11. The method of claim 1 in which the step of exposing the adhesive to heat to volatilize the adhesive sufficiently to permit the die to be picked up from the die support includes exposing the adhesive to a temperature less than about 400 degrees Centigrade.

* * * * *